| (12) | United States Patent<br>Zhang et al. | (10) Patent No.: US 9,748,735 B2<br>(45) Date of Patent: Aug. 29, 2017 |
|---|---|---|

(54) LIGHT-EFFECT TRANSISTOR (LET)

(71) Applicant: The University of North Carolina at Charlotte, Charlotte, NC (US)

(72) Inventors: Yong Zhang, Charlotte, NC (US); Jason Kendrick Marmon, Charlotte, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 15/209,360

(22) Filed: Jul. 13, 2016

(65) Prior Publication Data

US 2017/0104312 A1   Apr. 13, 2017

Related U.S. Application Data

(60) Provisional application No. 62/238,781, filed on Oct. 8, 2015.

(51) Int. Cl.
*H01S 3/094* (2006.01)
*H01S 5/062* (2006.01)
*H01S 5/068* (2006.01)

(52) U.S. Cl.
CPC ...... *H01S 5/06203* (2013.01); *H01S 5/06808* (2013.01); *H01S 3/094076* (2013.01)

(58) Field of Classification Search
CPC .......... H01S 3/094076; H01S 5/06203; H01S 5/06808
See application file for complete search history.

(56) References Cited

U.S. PATENT DOCUMENTS

| 2005/0215031 A1* | 9/2005 | Ouchi | G01J 3/0256 438/459 |
|---|---|---|---|
| 2015/0131685 A1* | 5/2015 | Schiffrin | G01J 11/00 372/30 |
| 2016/0020579 A1* | 1/2016 | Feng | G11C 13/047 365/114 |

OTHER PUBLICATIONS

Dogan et al., "4H-SiC photoconductive switching devices for use in high-power applications," Applied Physics Letters, vol. 82, pp. 3107-3109 (2003).
"The Nanodevice Aiming to Replace the Field Effect Transistor," Emerging Technology from the arXiv, MIT Technology Review (Feb. 2, 2016), available at https://www.technologyreview.com/profile/emerging-technology-from-the-arxiv/.

(Continued)

*Primary Examiner* — Eric Bolda
(74) *Attorney, Agent, or Firm* — McDonnell Boehnen Hulbert & Berghoff LLP

(57) ABSTRACT

Example photoconductive devices and example methods for using photoconductive devices are described. An example method may include providing a photoconductive device having a metal-semiconductor-metal structure. The method may also include controlling, based on a first input state, illumination of the photoconductive device by a first optical beam during a time period, and controlling, based on a second input state, illumination of the photoconductive device by a second optical beam during the time period. Further, the method may include detecting an amount of current produced by the photoconductive device during the time period, and based on the detected amount of current, providing an output indicative of the first input state and the second input state. The example devices can be used individually as discrete components or in integrated circuits for memory or logic applications.

20 Claims, 12 Drawing Sheets

(56) References Cited

OTHER PUBLICATIONS

Kind et al., "Nanowire Ultraviolet Photodetectors and Optical Switches," Advanced Materials, vol. 14, No. 2, pp. 158-160 (Jan. 16, 2002).

Kuo et al., "High sensitivity of middle-wavelength infrared photodetectors based on an individual InSb nanowire," Nanoscale Research Letters, 8:327 (2013).

Marmon et al., Light-Effect Transistor (LET) with Multiple Independent Gating Controls for Optical Logic Gates and Optical Amplification, Frontiers in Physics, vol. 4, Article 8, (Mar. 21, 2016).

Ramiro et al., "Optically triggered infrared photodetector," Nano Lett., 15:1, pp. 224-228 (Dec. 9, 2014).

Soci et al., "ZnO Nanowire UV Photodetectors with High Internal Gain," Nano Lett., 7:4, pp. 1003-1009 (2007).

\* cited by examiner

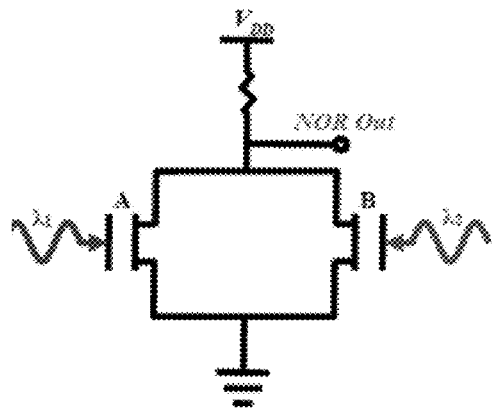
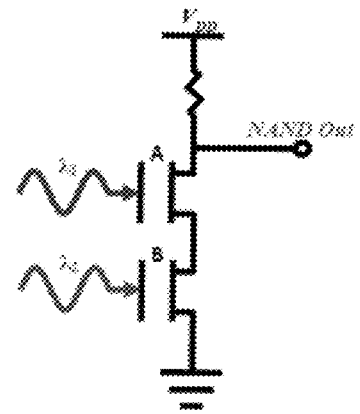
FIG. 6A  FIG. 6B
| $\lambda_1$ | $\lambda_2$ | A NOR B |
|---|---|---|
| 0 | 0 | 1 |
| 0 | 1 | 0 |
| 1 | 0 | 0 |
| 1 | 1 | 0 |
| $\lambda_1$ | $\lambda_2$ | A NAND B |
|---|---|---|
| 0 | 0 | 1 |
| 0 | 1 | 1 |
| 1 | 0 | 1 |
| 1 | 1 | 0 |
FIG. 6C  FIG. 6D

| $V_{SD}$ | $\lambda_{532\,nm}$ | $\lambda_{halogen}$ | $A \times B \times C$ |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 1 |
FIG. 7A
| $V_{SD}$ | $\lambda_{532\,nm}$ | $\lambda_{halogen}$ | $A \times (B+C)$ |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 1 |
| 1 | 1 | 0 | 1 |
| 1 | 1 | 1 | 1 |
FIG. 7B
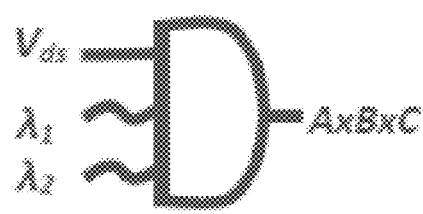
FIG. 7C
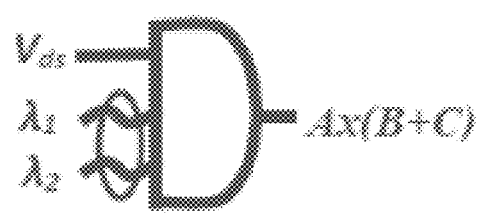
FIG. 7D

LIGHT-EFFECT TRANSISTOR (LET)

CROSS-REFERENCE TO RELATED APPLICATIONS

This disclosure claims the benefit of U.S. Provisional Application No. 62/238,781 filed on Oct. 8, 2015, the entirety of which is herein incorporated by reference.

FIELD

The present disclosure relates generally to electronic and optoelectronic devices, and more particularly, to a particular type of photoconductive device, referred to as a light-effect transistor (LET), and to methods for using a LET to perform optical gating and optical analog operations.

BACKGROUND

As basic electronics building blocks, field-effect transistor (FETs) are widely used in both logic and memory chips. A typical FET is a three-terminal device consisting of source (S), drain (D), and gate (G) contacts. In operation, conductivity between the S and D contacts is modulated by applying a voltage or an applied electric field through the G contact, resulting in ON and OFF states. Although FETs have evolved structurally from early planar geometries to their current three-dimensional (3D) geometries and have continually shrunk in size, the basic operating principal remains the same. The structural changes and shrinkage have led to ever greater fabrication complexity, and ultimately to challenges in gate fabrication and doping control.

Various new technologies, such as fin field-effect transistors (FinFETs) and tunnel-FETs have been developed in recent years to enable the continuation of Moore's law. Other types of FETs are also being explored as alternatives, such as semiconductor nanowire (SNW) based FETs, FETs comprised of two-dimensional (2D) materials, and FETs with multiple independent gates or gates with embedded ferroelectric material. However, the above-referenced technologies may not provide a clear pathway for eliminating gating complexity or avoiding difficulties with doping control. Furthermore, a viable rival technology does not currently exist.

SUMMARY

In one example, an optical gating method is described. The method includes providing a photoconductive device having a metal-semiconductor-metal structure. The method also includes controlling, based on a first input state, illumination of the photoconductive device by a first optical beam during a time period and controlling, based on a second input state, illumination of the photoconductive device by a second optical beam during the time period. In addition, the method includes detecting an amount of current produced by the photoconductive device during the time period. And the method includes, based on the detected amount of current, providing an output indicative of the first input state and the second input state.

In another example, a method for optical amplification is described. The method includes providing a photoconductive device having a metal-semiconductor-metal structure. The method also includes illuminating the photoconductive device using an optical beam while simultaneously exposing the photoconductive device to an optical signal during a time period. Further, the method includes detecting an amount of current produced by the photoconductive device during the time period. Illuminating the photoconductive device using the optical beam may amplify the amount of current induced by the optical signal.

In still another example, another optical gating method is described. The method includes providing a photoconductive device including two metal contacts separated by a semiconductor nanostructure channel. The method also includes controlling, based on a first input state, illumination of the semiconductor nanostructure channel by an optical beam during a time period and controlling, based on a second input state, a bias voltage applied across the two metal contacts during the time period. In addition, the method includes detecting an amount of current produced by the photoconductive device during the time period. And the method includes, based on the detected amount of current, providing an output indicative of the first input state and the second input state.

The foregoing summary is illustrative only and is not intended to be in any way limiting. In addition to the illustrative aspects, embodiments, and features described above, further aspects, embodiments, and features will be become apparent by reference to the following detailed description and accompanying figures.

BRIEF DESCRIPTION OF THE FIGURES

FIGS. 6A-6D illustrate example optical logic gate constructions and truth tables.

FIGS. 7A-7D illustrate additional example optical logic gate constructions and truth tables.

DETAILED DESCRIPTION

Figure 1A:
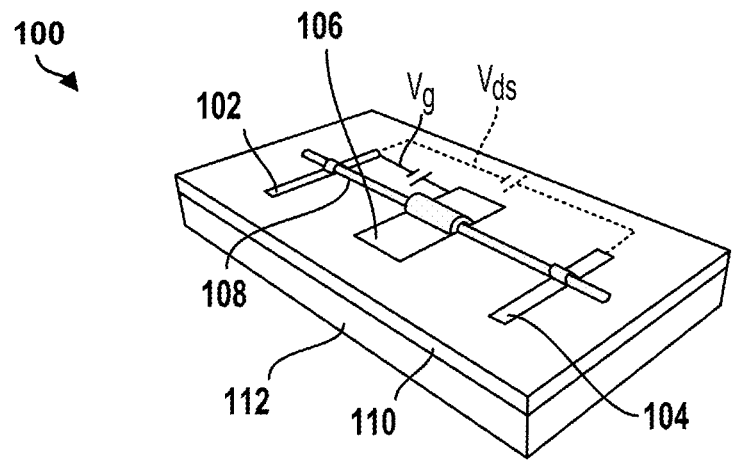
FIGS. 1A and 1B are a schematic comparison between an example FET and an example LET.

Example systems and methods are described herein. Any example embodiment or feature described herein is not necessarily to be construed as preferred or advantageous over other embodiments or features. The example embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the Figures should not be viewed as limiting. It should be understood that other embodiments might include more or less of each element shown in a given Figure. Further, some of the illustrated elements may be combined or omitted. Yet further, an example embodiment may include elements that are not illustrated in the figures.

As discussed above, this disclosure relates to a particular type of photoconductive device referred to as a LET. A LET has a metal-semiconductor-metal structure, with one of the metal-semiconductor junctions serving as an S contact and the other one of the metal-semiconductor junctions serving as a D contact. The S and D contact are separated by a semiconductor channel (e.g., a semiconductor nanostructure channel). Sometimes, a thin insulating layer can be added or may naturally exist between the S contact and the semiconductor channel and/or between the D contact and the semiconductor channel to achieve further device tuning. In operation, one or multiple independently controlled optical beams may be applied to the semiconductor channel to modulate the conductivity between the S and D contacts. In other words, a LET employs optical gating, which contrasts a FET's electrostatic control through an applied voltage.

As discussed more fully below, LETs exhibit electrical and optical characteristics that can replicate the basic switching function of a FET and also provide new functionalities not readily achievable by a FET. Advantageously, the simplistic architecture of a LET eliminates the above-referenced gate fabrication complexity and doping control challenges associated with FETs.

Within examples, methods for using a LET to implement electrical and optical hybrid logic gates are provided. In one example, a bias voltage may be applied across the S and D contacts of a LET while modulating illumination of the LET with a single beam. When the bias voltage is applied, illuminating the LET by the single beam induces a detectable, threshold high amount of current between the S and D contacts. Whereas, illuminating the LET without applying the bias voltage or applying the bias voltage without illuminating the LET does not induce as much current between the S and D contacts. Accordingly, a detector can measure the amount of current between the S and D contacts and then, based on the measured amount of current, provide an output indicative of whether the bias voltage is applied and the LET is illuminated. Hence, under single beam illumination, the FET can function as a hybrid AND logic gate. This basic operation mode can be used in different situations. For instance, this basic operation mode can be used to provide a logic switch in an integrated circuit containing a plurality of LETs, where each LET is nanoscale in size. Or this basic operation mode can be used to provide the function of an insulated-gate bipolar transistor (IGBT) in a power electronics device that is larger in size and handles large electrical signals.

Further, a pair of LETs can be combined, with each LET of the pair being controlled by a respective optical beam, to realize a universal logic gate (e.g., a NOR or NAND logic gate). Such universal logic gates can be used to build complex integrated logic circuits with high speed and low energy advantages as compared to FET-based technologies.

In other examples, a computing device such as a logic device may independently control illumination of a LET by at least two beams in order to implement an optical logic gate. For instance, the computing device may control, based on a first input state, illumination of the LET by a first optical beam during a time period and also control, based on a second input state, illumination of the LET by a second optical beam during the time period. A detector may then detect an amount of current produced by the LET during the time period. Based on the detected amount of current, the computing device may provide an output indicative of the first input state and the second input state. For instance, the output may be indicative of a logical combination of the first input state and the second input state.

In one instance, with a constant bias voltage applied across the S and D contacts, the two illuminating optical beams can result in optical AND or optical OR logic gates, depending on the operation point on the LET's transfer curve. In another instance, by controlling the bias voltage, logic gates with three inputs can be achieved.

Performing optical amplification using a LET may involve illuminating the LET using an optical beam while simultaneously exposing the LET to an optical signal during a time period. For instance, the LET may be illuminated with the optical beam while simultaneously exposing the LET to an infrared signal in an environment. Further, a bias voltage may be applied across two metal contacts of the LET. A computing device (e.g., a current meter) may then detect an amount of current produced by the LET during the time period. Advantageously, illuminating the LET using the optical beam may amplify the amount of current induced by the optical signal by a factor of at least ten. Hence, with this approach, a LET may be used for weak optical signal (e.g., infrared signal) detection.

Various example implementations of these methods are described below with reference to the figures.

Figure 1B:
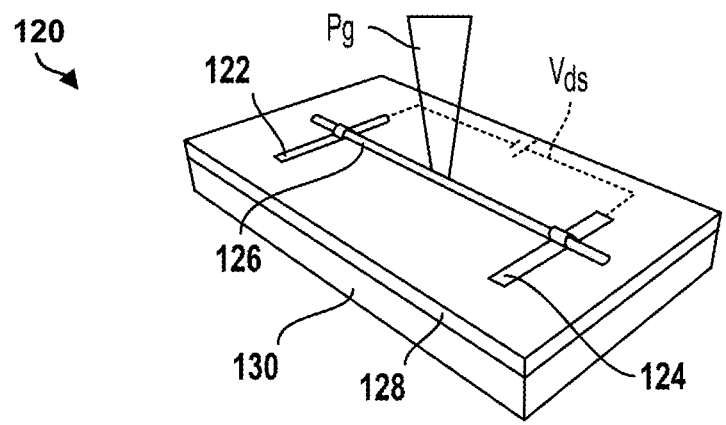

Referring now to the Figures, FIGS. 1A and 1B are a schematic comparison between a FET 100 and an example LET 120. As shown in FIG. 1A, the FET 100 includes an S contact 102, a D contact 104, and a G contact 106. A semiconductor nanostructure channel 108 connects the S contact 102 and the D contact 104. The S contact 102, D contact 104, G contact 106, and semiconductor channel 108 all overlay an insulating dielectric 110. Further, the insulating dielectric 110 rests upon a substrate 112.

In one example, the S contact 102, D contact 104, and G contact 106 may each be metal contacts, and the semiconductor nanostructure channel 108 may be a semiconductor nanowire. Further, the insulating dielectric 110 may be a silicon oxide layer and the substrate 112 may be a silicon substrate.

In operation, S-D current $I_{ds}$ between the S contact 102 and the D contact 104 through the semiconductor nanostructure channel 108 is driven by an S-D voltage $V_{ds}$ and modulated through a gate voltage $V_g$. Current carriers are generated by thermal activation of dopants.

Similarly, as shown in FIG. 1B, the LET 120 includes an S contact 122, a D contact 124, and a semiconductor nanostructure channel 126 connecting the S contact 122 and the D contact 124. Unlike the FET 100, however, the LET 120 does not include a G contact—no physical gate is required. The S contact 122, D contact 124, and semiconductor nanostructure channel 126 all overlay an insulating dielectric 128. Further, the insulating dielectric 128 rests upon a substrate 130.

In one example, the S contact 122 and D contact 124 may each be metal contacts, and the semiconductor nanostructure channel 126 may be a semiconductor nanowire. Further, the insulating dielectric 128 may be a silicon oxide layer and the substrate 130 may be a silicon substrate. In other examples, LETs may have larger size semiconductor channels. Hence, the semiconductor channel is not limited to nanoscale channels.

The operation mechanism of the LET 120 is distinctly different from the operation mechanism of the FET 100 in two regards. First, S-D current $I_{ds}$ between the S contact 122 and the D contact 124 is modulated by light or an optical frequency electromagnetic field $P_g(\lambda_g)$, which contrasts the control of the S-D current of the FET 100 through the gate voltage $V_g$. Second, in the LET 120, current carriers are generated through optical absorption rather than by thermal activation of dopants. In other words, the LET 120 uses optical gating based upon photoconductivity.

Under one-beam continuous wave operation, optical gating through $P_g(\lambda_g)$ has two basic control parameters: wavelength $\lambda_g$ and power level $P_g$. Optical gating can be extended to other operation modes. For instance, multiple independent beams and pulsed illumination may be represented as $P_g(\lambda_{g1}, \lambda_{g2}, \ldots, \lambda_{gN})$ and $P_g[(t_1,\lambda_{g1}), (t_2,\lambda_{g2}), \ldots, (t_N,\lambda_{gN})]$, respectively.

Because of the simplistic architecture of the LET 120 as compared to the architecture of the FET 100, the LET 120 provides several advantages over the FET 100. For example, the LET 120 eliminates gate fabrication complexity and avoids difficulties with doping control. As such, the LET 120 does not suffer from the two primary challenges faced by the FET 100 when attempting to downscale to the quantum regime. Furthermore, the LET 120 offers the potential for reduced fabrication costs as compared with the fabrication costs of the FET 100. Also, while the most basic application of the LET 120 emulates the FET 100 when it operates under one-beam illumination, the LET 120 offers functionalities not readily achievable by the FET 100, such as when responding to multiple independently controlled light beams. In addition, the frequency response of the LET 120 is limited by the carrier transit time through its conducting channel, while the frequency response of the FET 100 is limited by its gate capacitance. Thus, LETs can potentially operate at much higher frequencies, up to terahertz frequencies and beyond, and consequently can operate with far lower switching energies.

Light-induced electrical conductivity changes are typically used for photo-detection. However, photo-detectors may lack desirable FET-like characteristics and are therefore unsuitable for LET use or have not been characterized using the metrics relevant to a FET's switching application. Photo-detection typically relies upon a p-n junction-based device rather than a metal-semiconductor-metal device because metal-semiconductor-metal devices typically require a larger bias voltage to drive carriers. In addition, a p-n junction based photo-detector has a distinctly different current-voltage (I-V) characteristic under illumination than a metal-semiconductor-metal device—as the latter can offer an I-V characteristic resembling that of a FET with gate voltage on. Further, under simultaneous multi-beam illumination, which is usually irrelevant for photo-detection, the multiple independent gating capability enables a LET to demonstrate previously unreported functionalities, such as optical logic (e.g., AND and OR) gates and optical amplification as an analog application.

LETs are also capable of quantum scale operation. A LET shares the same limit of a FET, that is, nanostructure dimensions are practically achievable, e.g., 1-7 nm for Si nanowires. However, LETs do not require complex and sophisticated fabrication steps for physical gates and doping. In general, ballistic transport theory suggests that commercially viable currents could be achieved in quantum structures. The on-state energy consumption could be as low as ~13 nW/LET when $I_{ds}$=1 µA, and the required minimal $V_{ds}$ would only be 13 mV (not including the voltage drop over the semiconductor-metal junctions), when a minimum quantum conductance is assumed. Thus, LETs could operate with low energy consumption.

At least two basic illumination modes for LETs are possible, depending on the application: (i) uniform, broad-area illumination over a high-density LET array, or (ii) separated light beams directed to individual or small groups of LETs through, for instance, sharp fiber tips or nanoscale emitters embedded on the same chip. For either mode, multiple light sources of the same or different wavelength(s) and/or intensities can be combined into one beam but controlled independently.

Figure 2A:
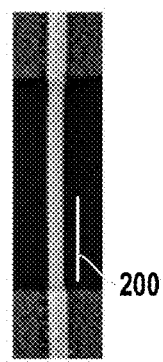
FIGS. 2A and 2B are images of an example LET.
Figure 2B:
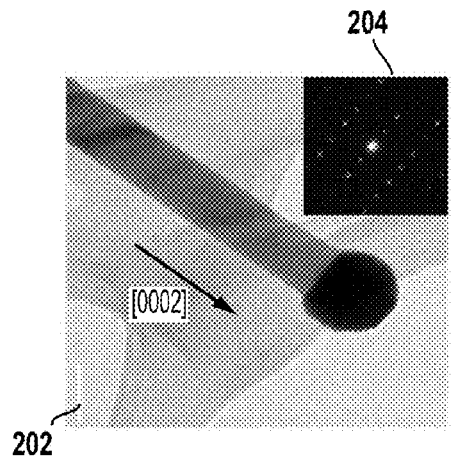

FIGS. 2A and 2B are images of an example LET. In particular, FIGS. 2A and 2B are images of a LET having a cadmium selenide (CdSe) nanowire and indium contacts. The CdSe nanowire was grown in a vertical array through gold-catalyzed chemical vapor deposition, and then dispersed in alcohol and drop cast onto a silicon/silicon oxide (Si/SiO$_2$) chip. The Si/SiO$_2$ chip consisted of an Si substrate coated with a 300-nm thick SiO$_2$ layer. After the CdSe nanowire was dispersed onto the chip, a thin poly-methyl methacrylate (PMMA) layer was spin coated onto the chip, followed by electron-beam lithography to open channels at the nanowire's ends. Exposed PMMA was removed by developing the chip. Afterwards, the chip was transferred to a thermal evaporator for indium metallization, followed by lift-off in acetone to obtain a finished device. In other examples, an array of nanowires can be grown on a patterned substrate, and processed into devices in parallel (not shown). Hence, the example images are not meant to be limiting.

FIG. 2A is a scanning electron microscope (SEM) image of a 10-µm long CdSe semiconductor nanowire (SNW) device with indium contacts forming metal-semiconductor (M-S) junctions at each end. The scale bar 200 in FIG. 2A is a 2-µm scale bar.

FIG. 2B is a low magnification transmission electron microscopy (TEM) image. As revealed by the low magnification TEM image of FIG. 2B, the CdSe SNW is a uniform single-crystalline CdSe SNW grown in wurtzite phase along the [0001] axis with a diameter of ~80 nm. The scale bar 202 in FIG. 2B is a 100-nm scale bar. The inset 204 in the image of FIG. 2B is a selected area electron diffraction (SAED) pattern.

Figure 2C:
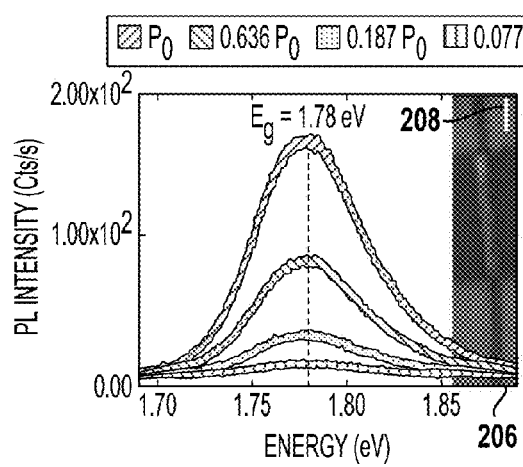
FIGS. 2C and 2D illustrate characteristics of the example LET of FIGS. 2A and 2B.

FIG. 2C depicts the CdSe SNW's laser-power-dependent photoluminescence (PL) obtained under 442-nm excitation at different powers, with $P_0$ equal to 1.5 µW. The PL shows a strong emission peak at 1.78 eV that matches CdSe's bandgap energy. The inset 206 overlays a PL map upon an optical image, demonstrating relatively homogeneous SNW emission, and by extension, homogenous material quality across the SNW channel. The scale bar 208 in the inset 208 is a 4-µm scale bar.

Figure 2D:
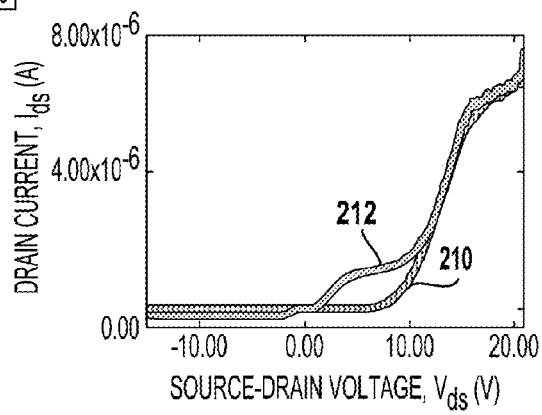

FIG. 2D depicts the output characteristic $I_{ds}$ vs. $V_{ds}$ for the CdSe SNW device, with and without illumination using a halogen light. The illumination optically modulates or "gates" the electrical conductivity between OFF and ON states. The first curve 210 represents $I_{ds}$ without illumination, and the second curve 212 represents $I_{ds}$ with illumination. The first and second curves 212, 214 resemble those of a FET's OFF and ON states, respectively, especially when $V_{ds}$<~7 V.

FIGS. 3A-3F illustrate output characteristics of two example LETs. In particular, FIGS. 3A-3F illustrate S-D current $I_{ds}$ as a function of the applied source-drain voltage $V_{ds}$ with varying gate power $P_0$ and wavelength $\lambda_g$ for two devices, device 1 (D1) and device 2 (D2). D1 and D2 have CdSe nanowires with lengths of ~10 µm and ~5.5 µm, respectively, and diameters of ~80 nm. Representative characteristics are shown in FIGS. 3A-3D for D1 and in FIGS. 3E-3F for D2. The $P_0$ values for FIGS. 3A-3D are 1.40, 2.07, 2.38, and 2.25 µW, respectively. The $P_0$ values for FIGS.

3E-3F are 1.38 and 69.1 µW, respectively. The dark current (no illumination) is represented in FIGS. 3A-3F as solid black lines.

The characteristics exemplify how LET performance depends on the gate power/wavelength, illumination condition, and device variation. By way of example, D1 exhibits two well-separated plateaus, respectively, starting at $V_{ds}$~4-5 V and ~14-18 V depending on the gate wavelength and power. For example, the second plateau's onset is at ~14-15 V for 633 nm illumination but shifts to ~16-18 V under 442-nm excitation. Two tunable plateaus can potentially offer two distinct, customizable ON states (e.g., a low-ON state and a high-ON state).

For D2, the first and second plateaus are comparatively not well separated, and both 532-nm and halogen illumination have their first plateau at ~2 V with respective power-dependent, second plateaus at ~6-7.5 V (532 nm) and ~5-5.75 V (halogen). Each plateau appears at respectively lower $V_{ds}$ values than in D1. Because of the extremely low dark current, the long second plateau extends to the highest $V_{ds}$ measured.

Figure 3A:
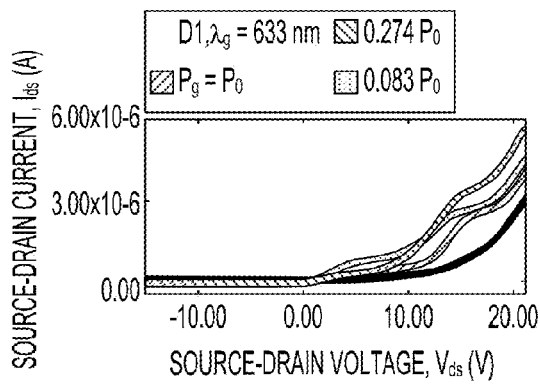
FIGS. 3A-3F illustrate output characteristics of two example LETs.
Figure 3B:
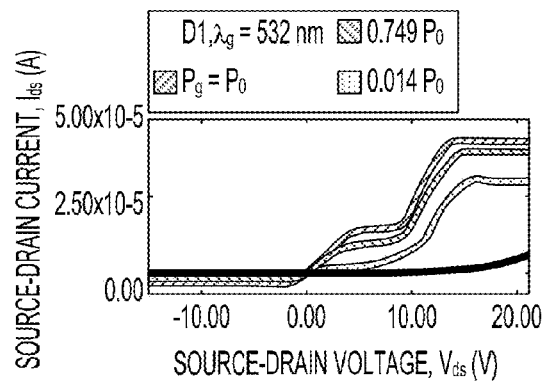
Figure 3C:
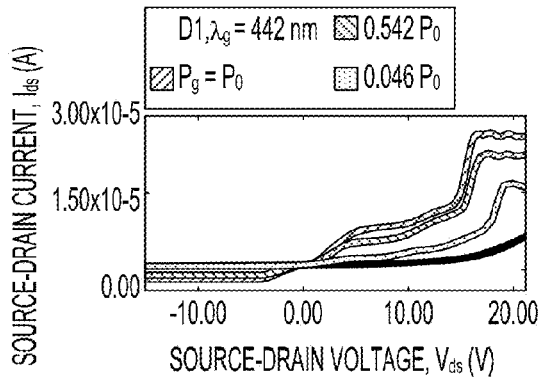
Figure 3D:
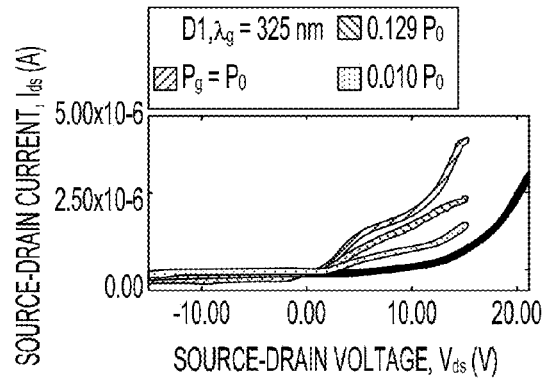
Figure 3E:
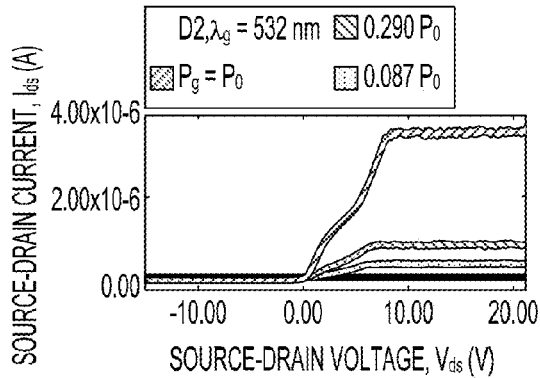
Figure 3F:
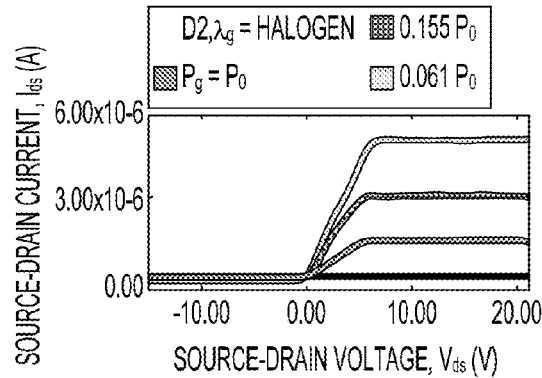

For D1, the maximum on/off ratios typically occur at $V_{ds}$<5 V, and vary from $10^2$ to $10^4$ depending on the gate power and wavelength. For instance, FIG. 3B shows on/off ratios of ~5×$10^4$ and ~2×$10^4$ at $V_{ds}$=1.43 V and 4.95 V, respectively, when $P_g$(532 nm)≈2 µW. FIG. 3E shows on/off ratios for D2 of ~1.0×$10^6$ and ~1.1×$10^6$ at $V_{ds}$=1.43 and 4.95 V, respectively, when $P_g$(532 nm)≈2.6 µW. FIG. 3F shows on/off ratios for D2 of ~6×$10^5$ and ~1×$10^6$ at $V_{ds}$=1.43 and 4.95 V, respectively, when $P_g$(halogen)≈69 µW.

Differences between D1 and D2 indicate that a LET's characteristics may be tuned and optimized through material and device engineering. A large metal-SW (M-SNW) contact barrier may be desirable for producing small OFF state currents over the operation range, and can be optimized to maximize the on/off ratio. Current levels for different "gate" wavelengths in FIGS. 3A-3D show considerable variations, which is fundamentally due to wavelength-dependent light-matter interaction effects, e.g., absorption and carrier dynamics, and illumination conditions, e.g., power density and beam size. This feature offers greater flexibility in achieving gate functions as compared with the flexibility in achieving gate functions with FETs.

FIGS. 4A-4F illustrate transfer characteristics of D1 and D2. In particular, FIGS. 4A-4F illustrates S-D current $I_{ds}$ as a function of laser power under different source-drain voltages $V_{ds}$. Representative characteristics are shown in FIGS. 4A-4D for D1 and in FIGS. 4E-4F for D2.

The transfer characteristics allow extraction of several performance metrics. A FET's threshold gate voltage $V_T$ and subthreshold swing S are respectively defined as the onset of a linear region in the $I_{ds}$-$V_g$ curve (i.e., voltage-controlled resistor behavior), and as the inverse linear slope on a semi-log $I_{ds}$-$V_g$ plot. Their physical interpretations, respectively, are the gate voltage required for device operation and the gate voltage increment to induce an order of magnitude current change below $V_T$. A small S value implies a small energy or power consumption to turn on or operate a FET.

The transfer characteristics for D1 and D2 generally resemble a FET's transfer characteristics, e.g., increasing $I_{ds}$ as the gate power $P_g$ increases under constant $V_{ds}$, except a LET replaces $V_g$ with $P_g$. A LET's threshold gate power $P_T$, then corresponds to the onset of a linear $I_{ds}$-$P_g$ region for a given $\lambda_g$, and $S_{TET}$ is its subthreshold swing. Significantly, FETs usually do not operate in the subthreshold swing region, while a LET can employ this range to realize optical logic gates and for an interesting optical amplification effect.

Figure 4A:
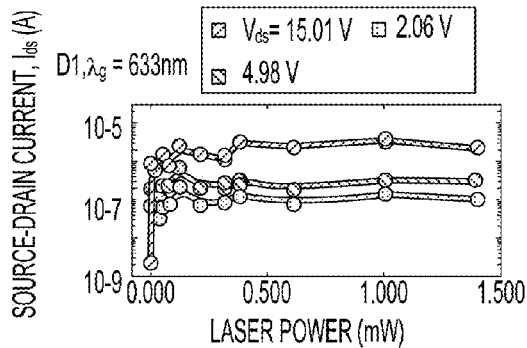
FIGS. 4A-4F illustrate transfer characteristics of the two example LETs discussed with reference to FIGS. 3A-3F.
Figure 4B:
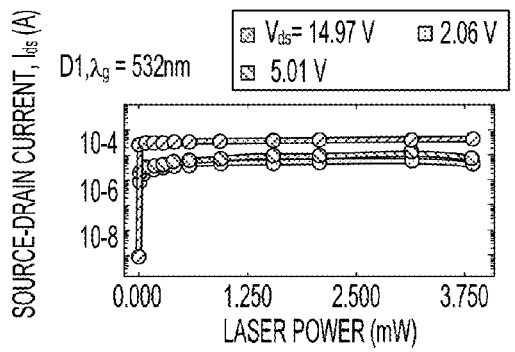
Figure 4C:
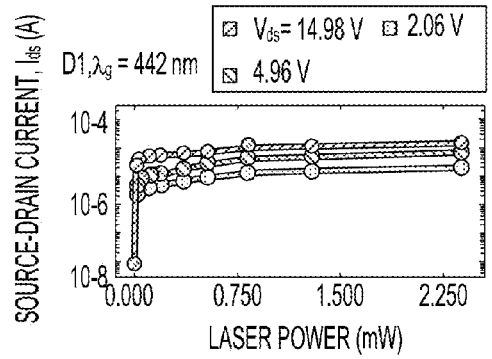
Figure 4D:
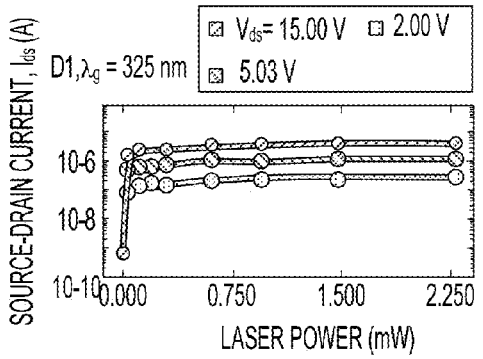
Figure 4E:
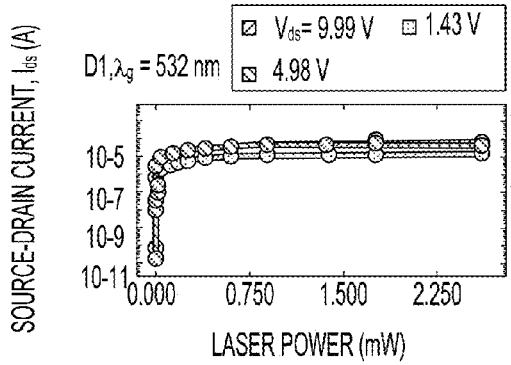
Figure 4F:
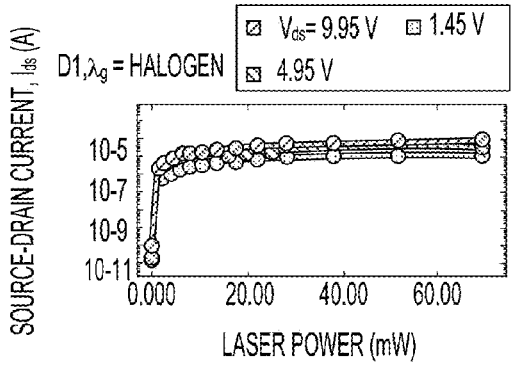

FIG. 4E, for example, shows that, with $\lambda_g$=532 nm, $P_T$ and $S_{TET}$ are ~30 nW and ~1.8 nW/decade, respectively. For reference, advanced FETs have respective $V_T$ and S parameters of 100-200 mV and ~70-90 mV/decade.

At $V_{ds}$=1.43 V, $P_g$=0.11 µW yields an $I_{ds}$ of 0.35 µA, and a LET dynamic power consumption of ~0.5 µW, which is comparable to advanced FETs. A LET's OFF state energy consumption can be very low. For instance, the dark current is ~1 pA at $V_{ds}$=1.43 V with a corresponding OFF power consumption of ~1.5 pW, which is lower than a FET of similar length.

The switching energy, or the amount of energy needed to go from OFF to ON states, of a LET can be lower than the switching energies of modern FETs. A LET can be viewed as a FET without the gate, which means that a LET's switching time is limited by the carrier transit time rather than a FET's capacitive delay. Most direct band gap semiconductors possess room temperature carrier lifetimes on the order of 100 ps without an applied bias, where applying a bias, especially for a short conducting channel length, reduces the transit time by more quickly wiping out free carriers. Simple estimates based on D2's performance support lower switching energies in LETs. For example, even an assumed 100 ps delay time would yield a switching energy of 0.05 fJ/switch (0.5 µW×100 ps) associated with the S-D current, and 0.01 fJ/switch (0.1 µW×100 ps) from the optical gating action, which yields a total switching energy less than typical FET values of 0.1-1.0 fJ/switch. The switching energy could be further reduced by reducing the channel length and optimizing the contacts.

Figure 5A:
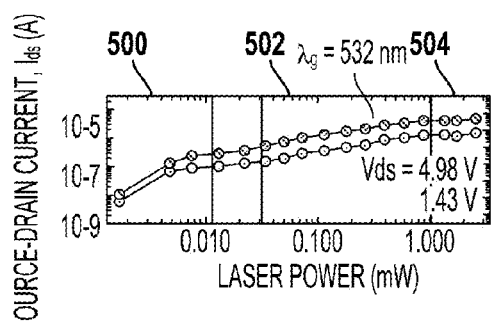
FIGS. 5A-5H illustrate example functionalities of the example LET discussed with reference to FIGS. 3E-3F.

The representative LET transfer characteristics in FIGS. 4A-4F can be used to illustrate the underlying principles for a few different applications. For example, FIGS. 5A-5H illustrate example functionalities using D2. In FIG. 5A, D2's 532-nm illumination characteristics (from FIG. 4E) are re-plotted on a double log scale. For clarity, only the curves for $V_{ds}$=1.43 and 4.98 V are shown. FIG. 5A shows three major operating regions: a super-linear region 500, a linear region 502, and a sublinear/saturation region 504. The applied gating power determines the operating region. For instance, in the example of FIG. 5A, D2 can be operated in the super-linear region 500 by applying a gating power of <0.010 µW, operated in the linear region 502 by applying a gating power of 0.1 µW, and operated in the sublinear/saturation region 504 by applying a gating power >1 µW.

Figure 5B:
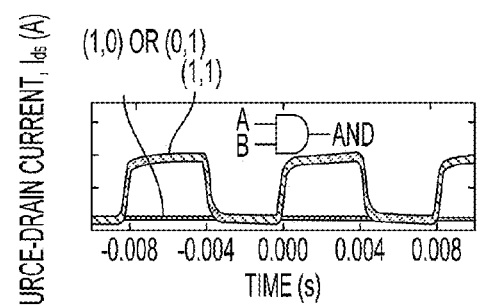

Each of the different regions can offer different unique applications. By way of example, FIG. 5B demonstrates single-beam illumination as a hybrid AND logic gate, which replicates the most basic FET logic function. An electrical input A=$V_{ds}$ and an optical input B=$P_g$ can each be controlled, and D2 can provide an output denoted as A×B. As shown in FIG. 5B, when either A or B is not applied (e.g., when $V_{ds}$=0 V or $P_g$=0 µW), D2 produces a threshold low $I_{ds}$. However, when both A and B are applied (e.g., when $V_{ds}$>a threshold $V_{ds}$ and $P_g$>a threshold $P_g$), D2 produces a threshold high $I_{ds}$.

Accordingly, when illumination of D2 is controlled based on a first input state (e.g., illuminating D2 if the first input state is an ON state but not illuminating D2 if the first input state is an OFF state) and the source-drain voltage is controlled based on a second input state (e.g., applying a source-drain voltage if the second input state is an ON state but not applying a source-drain voltage if the second input is an OFF state), the amount of source-drain current can be interpreted to determine whether both the first input state and the second input state are ON input states. For instance, detecting a threshold high amount of source-drain current can be interpreted to mean that both the first input state and the second input state are ON states. Whereas, detecting a threshold low amount of source-drain current can be interpreted to mean that one or both of the first input state and second input states are OFF states.

One-beam operation could also act as a current source or voltage amplifier when operating in the output characteristic's sublinear/saturation region 504. Further, a LET's two distinct ON states (e.g., the first and second plateaus in FIG. 3B) can be utilized to realize two-level logic gate and voltage amplifier functions. By way of example, applying any level of source-drain voltage without any illumination may induce a first, negligible amount of source-drain current, illuminating the LET and applying a first source-drain voltage may induce a second amount of source-drain current that is greater than the first source-drain current, and illuminating the LET and applying a second source-drain voltage may induce a third amount of source-drain current that is greater than the second amount of source-drain current. The amount of source-drain current can then be interpreted to determine whether the LET is illuminated and, if so, whether the applied source-drain voltage is the first source-drain voltage or the second source-drain voltage. If the first and second source-drain voltages represent two distinct input states, the amount of source-drain current can therefore be interpreted to determine the input state.

In addition, two LET devices can be combined in parallel or series to respectively create universal NOR and NAND logic gates. NOR and NAND logic gates are universal, which means that they can be used to construct most other logic circuits. Because a LET behaves similarly to an n-Metal-Oxide-Semiconductor FET (n-MOSFET), similar NOR and NAND logic circuits and truth tables may be constructed as illustrated in FIGS. 6A-6D. Logic inversion is possible given the high resistivity of an unilluminated LET (OFF state). In this case, the drive voltage, $V_{DD}$, goes directly to the output port. For the parallel LET devices in the NOR logic gate, FIG. 6A, illumination of either or both LET device(s), labelled as A and B, allows current to travel to ground, and yields an OFF state ("0") at the output port. An ON state ("1") is only possible when both LET devices are off or unilluminated. A NAND logic circuit, FIG. 6B, on the other hand, contains two LET devices in series. Illumination of either LET device is insufficient for current to travel to ground, which results in an ON state at the output port. Illuminating both devices, however, produces an OFF state at the output port. Truth tables for both of these gates are shown in FIGS. 6C and 6D, respectively.

Referring back to FIGS. 5A-5H, as discussed above, LETs also offer multi-independent gate operation, where optical gates do not increase device dimensions. To appreciate this functionality, consider a scenario in which a LET is illuminated with either uniform halogen illumination or focused illumination from a 532 nm laser, denoted as $P_{g1}$ and $P_{g2}$, respectively. Illumination by either individual light beam produces its corresponding transfer characteristics (as shown in FIGS. 4A-4F). Illumination by both beams simultaneously, however, produces a current enhancement.

Figure 5C:
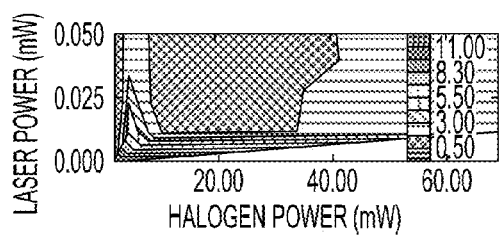

This effect is depicted in FIG. 5C, which is a contour plot showing the values of a current enhancement factor R achievable with a fixed $V_{ds}$ of 5.0 V, where $$R = \frac{I_{ds}(P_{g1}, P_{g2})}{I_{ds}(P_{g1}) + I_{ds}(P_{g2})}.$$

The current enhancement factor R varies based upon the applied $P_{g1}$ and $P_{g2}$. FIGS. 5D-5G demonstrate dual-gate applications in three different current enhancement regions.

Figure 5D:
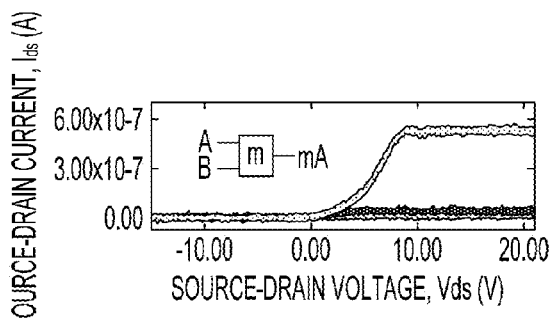

FIG. 5D demonstrates the ability of a LET to perform optical amplification. This can occur in the super-linear region 500 and where R>>1. In FIG. 5D, R≈9-11. As shown in FIG. 5D, single beam illumination induces currents of ~11 nA and ~37 nA under 532-nm excitation at 2 nW and halogen illumination at 1.57 μW, respectively. On the other hand, simultaneous illumination by the same two beams yields a current of ~525 nA. In other words, the simultaneous illumination yields a current that is approximately 11 times greater than the sum of the currents induced under single beam illumination. If the laser beam is viewed as a weak optical signal to be measured, and the halogen light is viewed as a gate signal, an amplification factor of m≈48 is obtained. This feature of a LET may find broad application in weak optical signal detection.

Figure 5E:
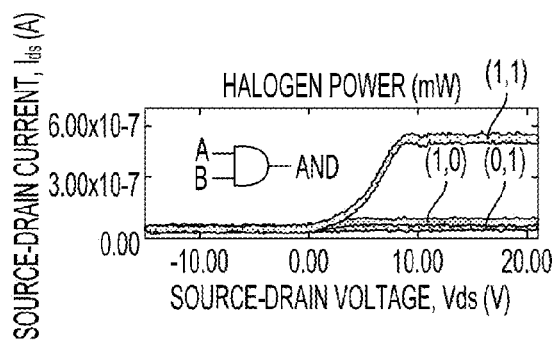

FIG. 5E demonstrates that, based on the results shown in FIG. 5D, a LET can also be used for optical logic operations. For example, two individually applied optical gates, with inputs of A and B, respectively, produce two low current or OFF states represented as (1,0) or (0,1) (the (0,0) OFF state is not shown for clarity). Only under simultaneous illumination does the device produce the ON or (1,1) state. Thus, when two beams are controlled based on two input states, respectively, the induced source-drain current can be interpreted to determine whether both of the input states are ON states.

Figure 5F:
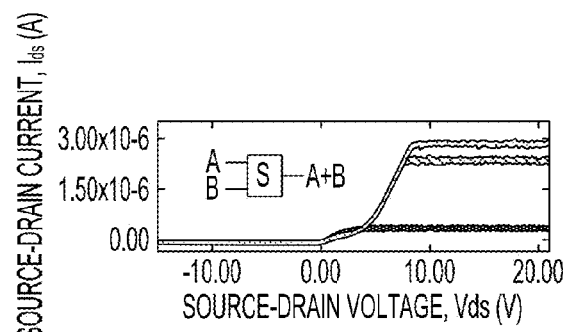

FIG. 5F demonstrates the ability of a LET to perform optical summation. This can occur in the linear region 502 and where R=1, for example. As shown in FIG. 5F, single beam illumination induces currents of ~2 μA and ~0.32 μA under 532-nm excitation at 0.63 μW and halogen illumination at 0.7 μW, respectively. On the other hand, simultaneous illumination by the same two beams yields a current of 2.43 μA or approximately their numerical sum. Thus, this region is convenient for producing multiple states, such as for memory devices.

For example, without any illumination, the LET may produce a first, negligible level of current corresponding to a first state. Further, illumination by only the first beam may produce a second level of current corresponding to a second state, illumination by only the second beam may produce a third level of current corresponding to a third state, and simultaneous illumination may produce a fourth level of current corresponding to a fourth state. A computing device can therefore interpret a detected amount of current as being indicative of one of the four states based on the detected amount of current being closest to a particular one of the four current levels.

Figure 5G:
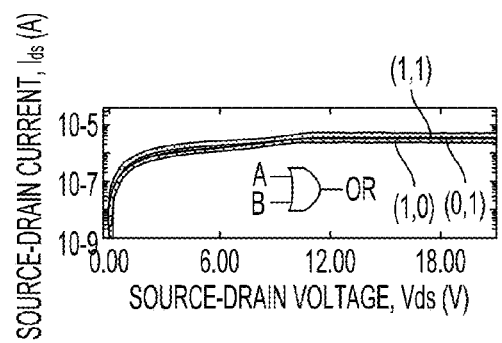

FIG. 5G demonstrates the ability of a LET to be used as an optical OR logic gate. This can occur in the sublinear/saturation region 504 and where R=½, for example. As shown in FIG. 5G, when A corresponds to 532-nm excitation at 0.63 μW and B corresponds to halogen illumination at 69.1 μW, individual illumination as (1,0) and (0,1) states or dual illumination as the (1,1) state all produce comparable $I_{ds}$ values; all three ON states contrast the OFF state which induces pA-level $I_{ds}$ (not shown for clarity).

A single LET could perform more complex logic functions concurrently by combining $V_{ds}$ control with dual optical gate ability, such as a three-terminal AND gate with output A×B×C, or with simultaneous AND and OR gates with A×(B+C) output. Truth tables for these logic operations and their proposed symbols are provided in FIGS. 7A-7D. In FIGS. 7A-7D, three inputs are A=$V_{ds}$, B=$P_{g1}$, and C=$P_{g2}$.

Changing between the two logic functions simply requires altering both optical gate powers from the super-linear region to the sublinear/saturation region.

Figure 5H:
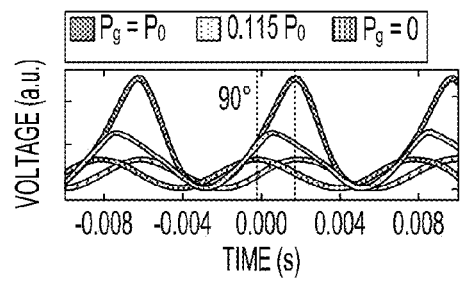

FIG. 5H demonstrates the ability of a LET to be used as a differentiator under zero or low $P_g$ or as an optically-gated phase tuner as $P_g$ is increased. In particular, FIG. 5H shows $I_{ds}(t)$ vs. $V_{ds}(t)$ curves for different $P_g$ values, where $V_{ds}(t)$ is a sine wave modulated with an amplitude of 5.0 V and a DC offset to remove the negative portion. The $I_{ds}(t)$ curve exhibits a 90-degree phase delay with respect to $V_{ds}(t)$ when $P_g=0$ (or $P_g$ is relatively low), which indicates that the device functions as a differentiator by converting the sine wave into a cosine wave. Increasing $P_g$ results in a tunable phase shift that gradually approaches zero, e.g., at $P_g=2.6$ µW. This effect can be understood as changing the LET's impedance by varying the gate power.

Figure 8:
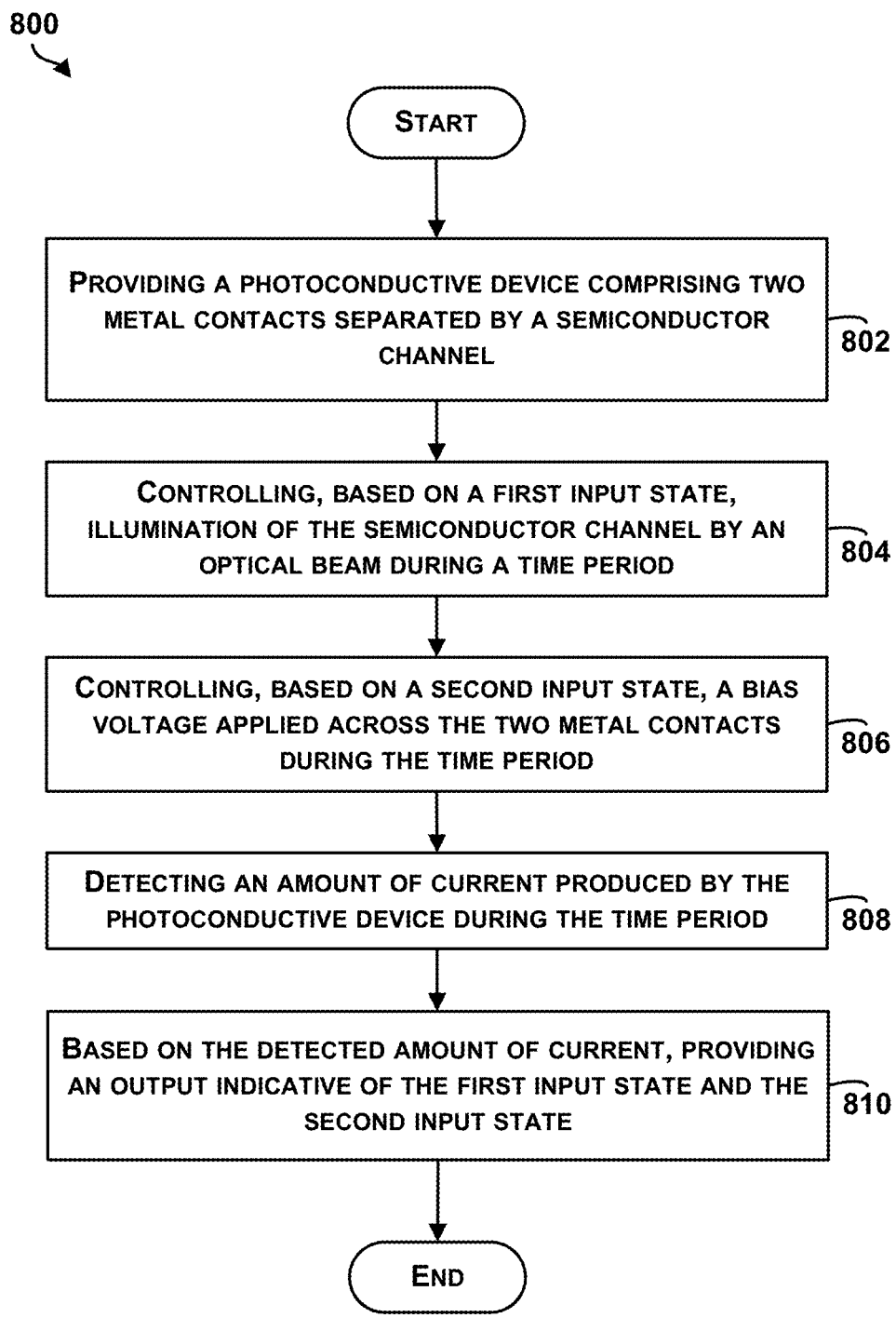
FIG. 8 is a flow chart of an example optical gating method, according to an example embodiment.

FIG. 8 is a flow chart of an example optical gating method. Method 800 shown in FIG. 8 presents an embodiment of a method that, for example, may be performed by one or more computing devices (or components of one or more computing devices). Example devices or systems may be used or configured to perform logical functions presented in FIG. 8. In some instances, components of the devices and/or systems may be configured to perform the functions such that the components are actually configured and structured (with hardware and/or software) to enable such performance. In other examples, components of the devices and/or systems may be arranged to be adapted to, capable of, or suited for performing the functions. Method 800 may include one or more operations, functions, or actions as illustrated by one or more of blocks 802-810. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

It should be understood that for this and other processes and methods disclosed herein, flowcharts show functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium or data storage, for example, such as a storage device including a disk or hard drive. The computer readable medium may include non-transitory computer readable medium or memory, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a tangible computer readable storage medium, for example.

In addition, each block in FIG. 8 may represent circuitry that is wired to perform the specific logical functions in the process. Alternative implementations are included within the scope of the example embodiments of the present disclosure in which functions may be executed out of order from that shown or discussed, including substantially concurrent or in reverse order, depending on the functionality involved, as would be understood by those skilled in the art.

At block 802, the method 800 includes providing a photoconductive device comprising two metal contacts separated by a semiconductor channel. For example, the photoconductive device may be the LET 120 of FIG. 1 or a LET that is similar to the LET 120 of FIG. 1. In one example, the semiconductor channel may be a semiconductor nanostructure.

At block 804, the method 800 includes controlling, based on a first input state, illumination of the semiconductor channel by an optical beam during a time period. In line with the discussion above, the optical beam may be provided using a laser configured to provide an optical beam with a particular wavelength and/or power level. The optical beam may be focused through one or more lenses at a particular area of the semiconductor channel. Alternatively, the optical beam may be provided using a light (e.g., a broad-band light source like halogen or other type of light like a single wavelength laser) configured to provide uniform illumination of the semiconductor channel. Depending on the desired configuration, the particular wavelength and/or power level of the optical beam may be selected in order to cause the photoconductive device to operate in a desired operating region (e.g., a super-linear region, a linear region, or a sublinear/saturation region).

Controlling illumination based on the first input state may involve illuminating the semiconductor channel if the first input state is an ON state but not illuminating the semiconductor channel if the first input state is an OFF state.

At block 806, the method 800 includes controlling, based on a second input state, a bias voltage applied across the two metal contacts during the time period. In line with the discussion above, the bias voltage may be a source-drain voltage. Controlling the bias voltage based on the second input state may involve applying a high voltage (e.g., 5 V) if the second input state is an ON state but applying a low voltage (e.g., 0 V) if the second input state is an OFF state. Alternatively, controlling the bias voltage based on the second input state may involve applying a first voltage (e.g., 0 V) if the second input state is an OFF state, applying a second voltage (e.g., 5 V) if the second input state is a low-ON state, and applying a third voltage (e.g., 14 V) if the second input state is a high-ON state).

At block 808, the method 800 includes detecting an amount of current produced by the photoconductive device during the time period. For example, the current may be detected using a current detector (e.g., a low voltage sourcemeter) having two electrical leads connected to the two metal contacts of the photoconductive device. In some instances, a current pre-amplifier may be used to amplify the current.

At block 810, the method 800 includes, based on the detected amount of current, providing an output indicative of the first input state and the second input state. In one example, the output may be indicative of whether the first and the second input states are both ON states. For instance, a computing device may be configured to determine whether the detected amount of current is greater than a threshold amount of current. If the computing device determines that the detected amount of current is greater than the threshold amount, the computing device may provide an output indicative of the first and second input states both being ON states. Whereas, if the computing device determines that the detected amount of current is not greater than the threshold amount, the computing device may provide an output indicative of one or both of the first and second input states being an OFF state.

In another example, the computing device may provide an output indicative of the first input state and the second input state depending on which of three predetermined current levels the detected amount of current is closest to. For instance, the first input state may be either an ON input state or an OFF input state, and the second input state may be either an OFF state, a low-ON state, or a high-ON state. If the detected amount of current is closest to a first current level, the computing device may provide an output indicative of the first input state and the second input state both being OFF states. If the detected amount of current is closest to a second current level that is greater than the first current level, the computing device may provide an output indicative of the first input state being an ON state and the second input state being a low-ON state. And if the detected amount of current is closest to a third current level that is greater than the second current level, the computing device may provide an output indicative of the first input state being an ON state and the second input state being a high-ON state. The second current level and the third current level could, for example, correspond to the first and second plateaus visible in FIG. 3B.

Figure 9:
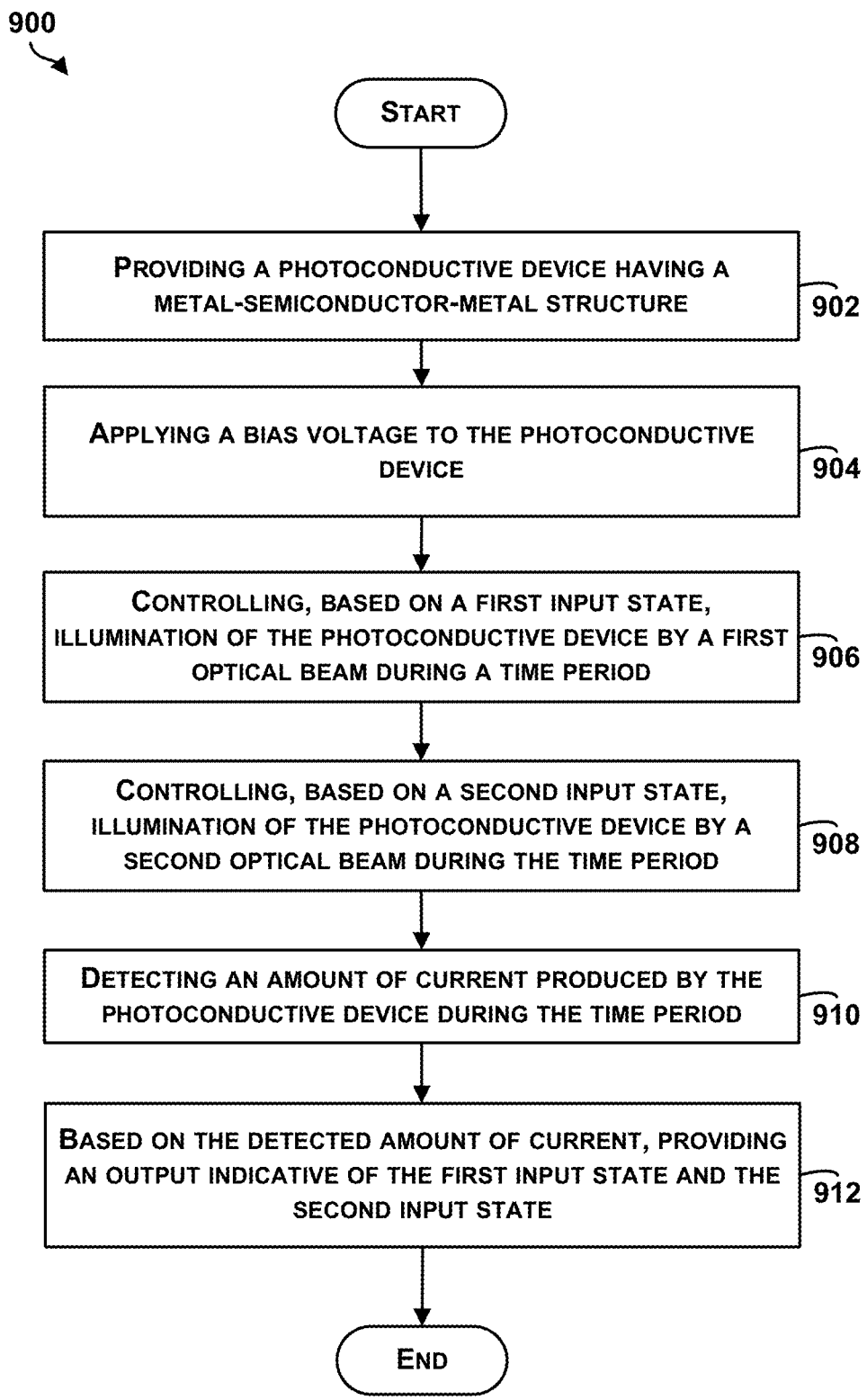
FIG. 9 is a flow chart of another example optical gating method, according to an example embodiment.

FIG. 9 is a flow chart of another example optical gating method. Method 900 shown in FIG. 9 presents an embodiment of a method that, for example, may be performed by one or more computing devices (or components of one or more computing devices).

At block 902, the method 900 includes providing a photoconductive device having a metal-semiconductor-metal structure. For example, the photoconductive device may be the LET 120 of FIG. 1 or a LET that is similar to the LET 120 of FIG. 1. Accordingly, the photoconductive device may include two metal contacts separated by a semiconductor channel (e.g., a semiconductor nanostructure).

At block 904, the method 900 includes applying a bias voltage to the photoconductive device. For example, the bias voltage may be applied across two metal contacts of the photoconductive device.

At block 906, the method 900 includes controlling, based on a first input state, illumination of the photoconductive device by a first optical beam during a time period. In line with the discussion above, the first optical beam may be provided using a laser configured to provide an optical beam with a particular wavelength and/or power level. The first optical beam may be focused through one or more lenses at a particular area of the semiconductor nanostructure channel. Alternatively, the first optical beam may be provided using a light (e.g., a broad-band light source like halogen or other type of light like a single wavelength laser) configured to provide uniform illumination of the semiconductor nanostructure channel. Depending on the desired configuration, the particular wavelength and/or power level of the first optical beam may be selected in order to cause the photoconductive device to operate in a desired operating region (e.g., a super-linear region, a linear region, or a sublinear/saturation region).

Controlling illumination based on the first input state may involve illuminating the semiconductor channel using the first optical beam if the first input state is an ON state but not illuminating the semiconductor channel using the first optical beam if the first input state is an OFF state.

At block 908, the method 900 includes controlling, based on a second input state, illumination of the photoconductive device by a second optical beam during the time period. The second optical beam may be provided using a laser configured to provide an optical beam with a particular wavelength and/or power level. The second optical beam may be focused through one or more lenses at a particular area of the semiconductor nanostructure channel. Alternatively, the second optical beam may be provided using a light (e.g., a halogen or other type of light) configured to provide uniform illumination of the semiconductor nanostructure channel. Depending on the desired configuration, the particular wavelength and/or power level of the second optical beam may be selected in order to cause the photoconductive device to operate in a desired operating region (e.g., a super-linear region, a linear region, or a sublinear/saturation region).

Controlling illumination based on the second input state may involve illuminating the semiconductor channel using the second optical beam if the second input state is an ON state but not illuminating the semiconductor channel using the second optical beam if the second input state is an OFF state.

In one example, the first optical beam and the second optical beam can be combined into one beam but controlled independently. With this approach, the first optical beam and the second optical beam may be directed at substantially the same area of the semiconductor nanostructure. In other examples, the first optical beam and the second optical beam may be directed at substantially different areas of the semiconductor nanostructure.

At block 910, the method 900 includes detecting an amount of current produced by the photoconductive device during the time period. For example, the current may be detected using a current detector (e.g., a low voltage sourcemeter) having two electrical leads connected to the two metal contacts of the photoconductive device. In some instances, a current pre-amplifier may be used to amplify the current.

At block 912, the method 900 includes, based on the detected amount of current, providing an output indicative of the first input state and the second input state. In some instances, the output may be indicative of a logical combination of the first input state and the second input state. For instance, the output may be indicative of whether the first and the second input states are both ON states. To provide such an output, the computing device may be configured to determine whether the detected amount of current is greater than a threshold amount of current. If the computing device determines that the detected amount of current is greater than the threshold amount, the computing device may provide an output indicative of the first and second input states both being ON states. Whereas, if the computing device determines that the detected amount of current is not greater than the threshold amount, the computing device may provide an output indicative of one or both of the first and second input states being an OFF state.

In another configuration, the output may be indicative of whether the first or the second input state is an ON state. To provide such an output, the computing device may be configured to determine whether the detected amount of current is greater than a threshold amount of current. If the computing device determines that the detected amount of current is greater than the threshold amount, the computing device may provide an output indicative of one or both of the first and second input states being ON states. Whereas, if the computing device determines that the detected amount of current is not greater than the threshold amount, the computing device may provide an output indicative of both the first and second input states being an OFF state.

In other examples, the computing device may provide an output indicative of the first input state and the second input state depending on which of a plurality of predetermined current levels that the detected amount of current is closest to. For instance, both the first input state and the second input state may either be ON states or OFF states, and the computing device may provide a particular output depending on which of four predetermined current levels the detected amount of current is closest to. If the detected amount of current is closest to a first current level, the computing device may provide an output indicative of the first input state and the second input state both being OFF states. If the detected amount of current is closest to a second current level that is greater than the first current level, the computing device may provide an output indicative of the first input state being an ON state and the second input state being an OFF state. If the detected amount of current is closest to a third current level that is greater than the second current level, the computing device may provide an output indicative of the first input state being an OFF state and the second input state being an ON state. And if the detected amount of current is closest to a fourth current level that is greater than the third current level, the computing device may provide an output indicative of both the first input state and the second input state being an ON state. The four current levels could, for example, correspond to the four current levels visible in FIG. 5F. In other examples, there may be more or less predetermined current levels to which the detected amount of current is compared, depending on the particular configuration.

In some examples, the method 900 may further include controlling, based on a third input state, the bias voltage applied across the two metal contacts during the time period. Controlling the bias voltage based on the third input state may involve applying a high voltage (e.g., 5 V) if the third input state is an ON state but applying a low voltage (e.g., 0 V) if the third input state is an OFF state. Further, as discussed above with reference to FIG. 7, the output at block 912 may then be indicative of a logical combination of the first input state, the second input state, and the third input state. For instance, the output may indicative of whether all three of the input states are ON states. Or the output may indicative of whether the third input state is an ON state and one or both of the first and second input states are ON states.

Figure 10:
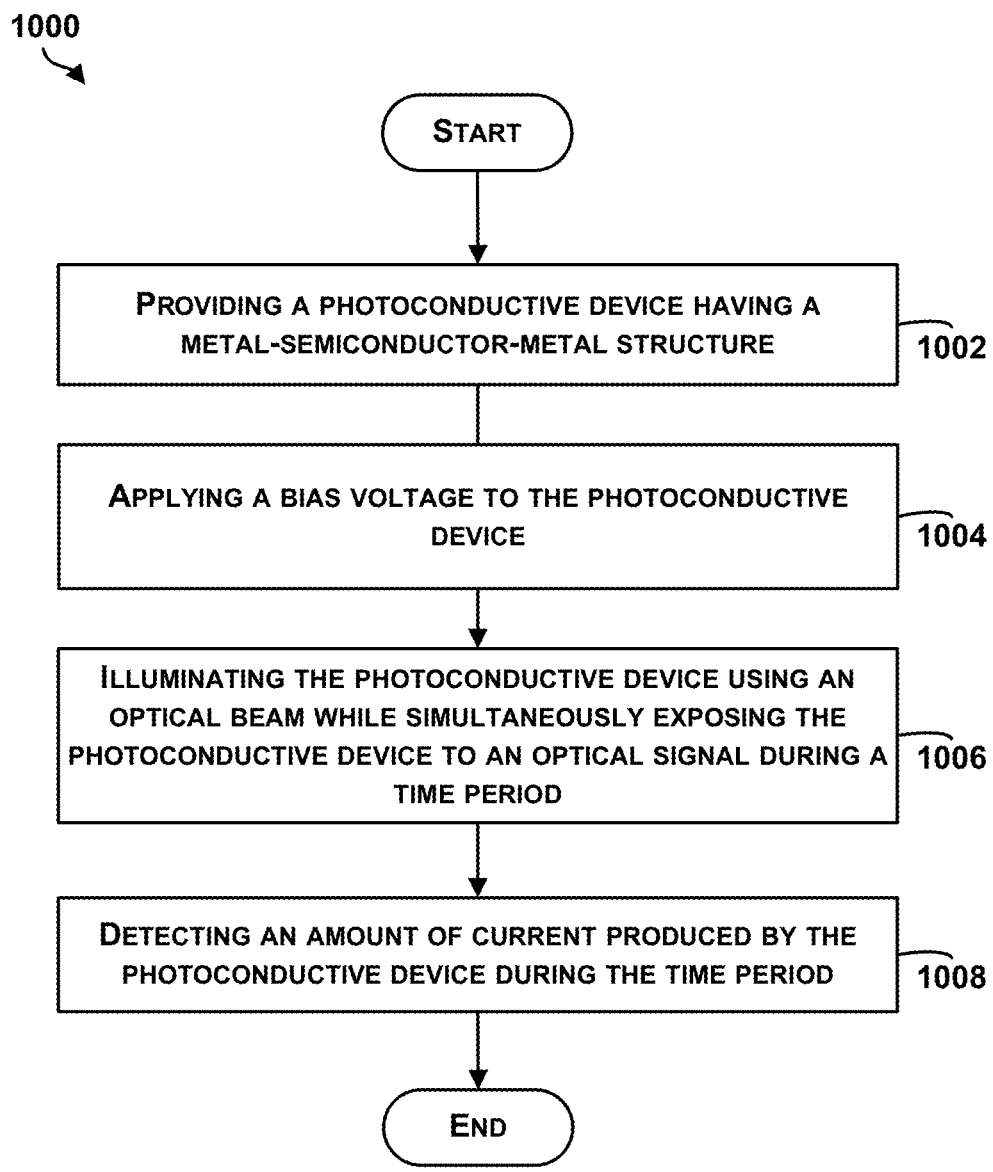
FIG. 10 is a flow chart of an example method for optical amplification.

FIG. 10 is a flow chart of an example method for optical amplification. Method 1000 shown in FIG. 10 presents an embodiment of a method that, for example, may be performed by one or more computing devices (or components of one or more computing devices).

At block 1002, the method 1000 includes providing a photoconductive device having a metal-semiconductor-metal structure. For example, the photoconductive device may be the LET 120 of FIG. 1 or a LET that is similar to the LET 120 of FIG. 1. Accordingly, the photoconductive device may include two metal contacts separated by a semiconductor channel (e.g., a semiconductor nanostructure).

At block 1004, the method 1000 includes applying a bias voltage to the photoconductive device. For example, the bias voltage may be applied across two metal contacts of the photoconductive device.

At block 1006, the method 1000 includes illuminating the photoconductive device using an optical beam while simultaneously exposing the photoconductive device to an optical signal during the time period. The optical beam may be provided using a laser configured to provide an optical beam with a particular wavelength and/or power level. The optical beam may be focused through one or more lenses at a particular area of the semiconductor channel. Alternatively, the optical beam may be provided using a light (e.g., a halogen or other type of light) configured to provide uniform illumination of the semiconductor channel. The particular wavelength and/or power level of the optical beam may be selected in order to cause the photoconductive device to operate in a desired operating region (e.g., a super-linear region). In some examples, the optical beam and the optical signal may be in different wavelength regions. For instance, one of the optical beam and the optical signal may be infrared and the other may be visible, one of the optical beam and the optical signal may be visible and the other may be ultraviolet, etc.

Exposing the photoconductive device to the optical signal may include exposing the semiconductor channel to the optical signal. In some examples, the optical signal may be an infrared signal. The optical signal may be focused (e.g., through one or more lenses) to a particular area of the semiconductor channel. Alternatively, the optical signal may illuminate the whole semiconductor channel.

At block 1008, the method 1000 includes detecting an amount of current produced by the photoconductive device during the time period. For example, the current may be detected using a current detector (e.g., a low voltage sourcemeter) having two electrical leads connected to the two metal contacts of the photoconductive device. In some instances, a current pre-amplifier may be used to amplify the current.

In line with the discussion above, advantageously, illuminating the photoconductive device using the optical beam may amplify the amount of current induced by the optical signal by a factor of at least 10. In some instances, illuminating the photoconductive device using the optical beam may amplify the amount of current induced by the optical signal by a factor of at least 40.

In some examples, the method 1000 may further include applying a bias voltage across the two metal contacts while illuminating the photoconductive device using the optical beam and simultaneously exposing the photoconductive device to the optical signal.

In one configuration, the photoconductive device may include an array of LETs. Further, the array of LETs may be illuminated with uniform, broad-area illumination while exposing the array of LETs to an optical signal. The optical signal may pass through one or more lenses or other optical components which direct portions of the optical signal to individual LETs of the array. The computing device could then be configured to detect individual current levels induced in each of the LETs of the array, and to process the individual current levels to create an image. With this approach, the detected amount of current from each LET of the array may be proportional to an intensity of the optical signal. Other configurations are also possible.

Figure 11:
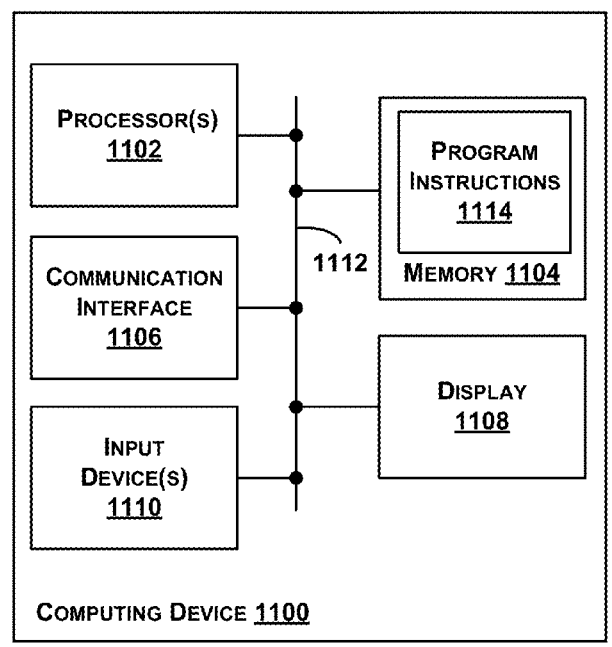
FIG. 11 is a schematic diagram of an example computing device according to an example embodiment.

As mentioned, portions of the methods 800, 900, and 1000 may be performed by one or more computing devices (or components of one or more computing devices). FIG. 11 is a schematic diagram of an example computing device 1100. In some examples, some components illustrated in FIG. 11 may be distributed across multiple computing devices. However, for the sake of example, the components are shown and described as part of one example device 1100. The computing device 1100 may be or include a mobile device, desktop computer, email/messaging device, tablet computer, or similar device that may be configured to perform the functions described herein.

As shown in FIG. 11, the computing device 1100 may include one or more processors 1102, a memory 1104, a communication interface 1106, a display 1108, and one or more input devices 1110. Components illustrated in FIG. 11 may be linked together by a system bus, network, or other connection mechanism 1112. The computing device 1100 may also include hardware to enable communication within the computing device 1100 and between the computing device 1100 and another computing device (not shown), such as a server entity. The hardware may include transmitters, receivers, and antennas, for example.

The one or more processors 1102 may be any type of processor, such as a microprocessor, digital signal processor, multicore processor, etc., coupled to the memory 1104. The memory 1104 may be any type of memory, such as volatile memory like random access memory (RAM), dynamic random access memory (DRAM), static random access memory (SRAM), or non-volatile memory like read-only memory (ROM), flash memory, magnetic or optical disks, or compact-disc read-only memory (CD-ROM), among other devices used to store data or programs on a temporary or permanent basis.

Additionally, the memory 1104 may be configured to store program instructions 1114. The program instructions 1114 may be executable by the one or more processors 1102. For instance, the program instructions 1114 may cause the one or more processors 1102 to perform any of the functions of methods 800, 900, and 1000, or any of the functions described herein.

The communication interface 1106 may be configured to facilitate communication with one or more other devices, in accordance with one or more wired or wireless communication protocols. For example, the communication interface 1106 may be configured to facilitate wireless data communication for the computing device 1100 according to one or more wireless communication standards, such as one or more IEEE 802.11 standards, ZigBee standards, Bluetooth standards, etc. As another example, the communication interface 1106 may be configured to facilitate wired data communication with one or more other computing devices, such as one or more cloud-connected computing devices or servers.

The display 1108 may be any type of display component configured to display data. As one example, the display 1108 may include a touchscreen display. As another example, the display may include a flat-panel display, such as a liquid-crystal display (LCD) or a light-emitting diode (LED) display.

The one or more input devices 1110 may include one or more pieces of hardware equipment used to provide data and control signals to the computing device 1100. For instance, the one or more input devices 1110 may include a mouse or pointing device, a keyboard or keypad, a microphone, a touchpad, a touchscreen, or a camera, among other possible types of input devices.

The description of the different advantageous arrangements has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method comprising:
   providing a photoconductive device having a metal-semiconductor-metal structure;
   controlling, based on a first input state, illumination of the photoconductive device by a first optical beam during a time period;
   controlling, based on a second input state, illumination of the photoconductive device by a second optical beam during the time period;
   detecting an amount of current produced by the photoconductive device during the time period; and
   based on the detected amount of current, providing an output indicative of the first input state and the second input state.

2. The method of claim 1:
   wherein the photoconductive device comprises two metal contacts separated by a semiconductor channel,
   wherein controlling illumination of the photoconductive device by the first optical beam comprises controlling illumination of the semiconductor channel by the first optical beam, and
   wherein controlling illumination of the photoconductive device by the second optical beam comprises controlling illumination of the semiconductor channel by the second optical beam.

3. The method of claim 2, wherein detecting the amount of current produced by the photoconductive device comprises detecting an amount of current flowing between the two metal contacts.

4. The method of claim 2, wherein the semiconductor channel comprises a semiconductor nanostructure channel.

5. The method of claim 2, further comprising:
   controlling, based on a third input state, a bias voltage applied across the two metal contacts during the time period,
   wherein the output is indicative of a logical combination of the first input state, the second input state, and the third input state.

6. The method of claim 2, wherein the first optical beam and the second optical beam are directed at substantially the same area of the semiconductor channel.

7. The method of claim 2, wherein the first optical beam and the second optical beam are directed at substantially different areas of the semiconductor channel.

8. The method of claim 2, wherein the illumination of the semiconductor channel by the first optical beam comprises focused illumination of a particular area of the semiconductor channel, and wherein the illumination of the semiconductor channel by the second optical beam comprises uniform illumination of the semiconductor channel.

9. The method of claim 1, wherein the output is indicative of a logical combination of the first input state and the second input state.

10. The method of claim 9, wherein providing, based on the detected amount of current, the output indicative of the first input state and the second input state comprises:
    providing an ON output if the detected amount of current is greater than a threshold current, wherein the ON output is indicative of the first input state and the second input state both being ON states; and
    providing an OFF output if the detected amount of current is not greater than the threshold current, wherein the OFF output is indicative of one or both of the first input state and the second input state being an OFF state.

11. The method of claim 9, wherein providing, based on the detected amount of current, the output indicative of the first input state and the second input state comprises:
    providing an ON output if the detected amount of current is greater than a threshold current, wherein the ON output is indicative of one or both of the first input state and the second input state being ON states; and providing an OFF output if the detected amount of current is not greater than the threshold current, wherein the OFF output is indicative of both the first input state and the second input state being an OFF state.

12. The method of claim 1, wherein providing, based on the detected amount of current, the output indicative of the first input state and the second input state comprises providing a particular one of at least four output states based on the detected amount of current being closest to a particular one of at least four respective predetermined current levels.

13. The method of claim 1:
wherein controlling, based on the first input state, the illumination of the photoconductive device by the first optical beam comprises illuminating the photoconductive device with the first optical beam if the first input state is an ON input state but not illuminating the photoconductive device with the first optical beam if the first input state is an OFF input state, and wherein controlling, based on the second input state, the illumination of the photoconductive device by the second optical beam comprises illuminating the photoconductive device with the second optical beam if the second input state is an ON input state but not illuminating the photoconductive device with the second optical beam if the second input state is an OFF input state.

14. A method for optical amplification, comprising:
providing a photoconductive device having a metal-semiconductor-metal structure;
illuminating the photoconductive device using an optical beam while simultaneously exposing the photoconductive device to an optical signal during a time period; and
detecting an amount of current produced by the photoconductive device during the time period;
wherein illuminating the photoconductive device using the optical beam amplifies the amount of current induced by the optical signal.

15. The method of claim 14:
wherein the photoconductive device comprises two metal contacts separated by a semiconductor channel,
wherein illuminating the photoconductive device using the optical beam comprises illuminating the semiconductor channel using the optical beam, and
wherein exposing the photoconductive device to the optical signal comprises exposing the semiconductor channel to the optical signal to be measured.

16. The method of claim 15, further comprising applying a bias voltage across the two metal contacts while illuminating the photoconductive device using the optical beam and simultaneously exposing the photoconductive device to the optical signal, wherein illuminating the photoconductive device using the optical beam amplifies the current induced by the optical signal by a factor of at least 10.

17. The method of claim 14, wherein exposing the photoconductive device to the optical signal comprises focusing the optical signal to a particular area of the semiconductor channel.

18. A method comprising:
providing a photoconductive device comprising two metal contacts separated by a semiconductor channel;
controlling, based on a first input state, illumination of the semiconductor channel by an optical beam during a time period;
controlling, based on a second input state, a bias voltage applied across the two metal contacts during the time period;
detecting an amount of current produced by the photoconductive device during the time period; and
based on the detected amount of current, providing an output indicative of the first input state and the second input state.

19. The method of claim 18, wherein providing, based on the detected amount of current, the output indicative of the first input state and the second input state comprises:
providing an ON output if the detected amount of current is greater than a threshold current, wherein the ON output is indicative of the first input state and the second input state both being ON states; and
providing an OFF output if the detected amount of current is not greater than the threshold current, wherein the OFF output is indicative of one or both of the first input state and the second input state being an OFF state.

20. The method of claim 18, wherein providing, based on the detected amount of current, the output indicative of the first input state and the second input state comprising:
providing a first output state if the detected amount of current is closest to a first one of three predetermined current levels, wherein the first output state is indicative of both the first input state and the second input state being OFF states;
providing a second output state if the detected amount of current is closest to a second one of the three predetermined current levels, wherein the second output state is indicative of the first input state being an ON input state and the second input state being a low-ON state; and
providing a third output state if the detected amount of current is closest to a third one of the three predetermined current levels, wherein the third output state is indicative of the first input state being an ON input state and the second input state being a high-ON state.

* * * * *